United States Patent

Sindzingre et al.

[11] Patent Number: 5,807,615
[45] Date of Patent: *Sep. 15, 1998

[54] METHOD AND DEVICE FOR FORMING AN EXCITED GASEOUS TREATMENT ATMOSPHERE LACKING ELECTRICALLY CHARGED SPECIES USED FOR TREATING METALLIC SUBSTRATES

[75] Inventors: Thierry Sindzingre, Cachan; Stéphane Rabia, Gif sur Yvette, both of France

[73] Assignee: L'Air Liquide, Societe Anonyme pour l'Etude et l'Exploitation des Procedes Georges Claude, Paris, France

[ * ] Notice: The term of this patent shall not extend beyond the expiration date of Pat. No. 5,807,614.

[21] Appl. No.: 663,164
[22] PCT Filed: Dec. 7, 1994
[86] PCT No.: PCT/FR94/01423
   § 371 Date: Jun. 6, 1996
   § 102(e) Date: Jun. 6, 1996
[87] PCT Pub. No.: WO95/16802
   PCT Pub. Date: Jun. 22, 1995

[30] Foreign Application Priority Data

Dec. 15, 1993 [FR] France .................... 93 15109

[51] Int. Cl.$^6$ .................................... C23C 16/22
[52] U.S. Cl. .......................... 427/562; 427/563; 427/574; 427/578; 427/579; 427/585; 427/255.1; 427/255.2; 427/255.5; 427/255.7; 118/719; 118/723 ER; 118/729

[58] Field of Search .................. 427/562, 563, 427/574, 578, 579, 585, 255.1, 255.2, 255.5, 255.7; 118/719, 723 ER, 729

[56] References Cited

U.S. PATENT DOCUMENTS

| 4,774,062 | 9/1988 | Heinemann | 422/186.19 |
| 4,951,602 | 8/1990 | Kanai | 118/719 |
| 5,114,529 | 5/1992 | Masuyama et al. | 156/643 |
| 5,124,173 | 6/1992 | Uchiyama et al. | 427/38 |
| 5,458,856 | 10/1995 | Marie et al. | 422/186 |

FOREIGN PATENT DOCUMENTS 513634  11/1992  European Pat. Off. .

*Primary Examiner*—Shrive Beck
*Assistant Examiner*—Timothy Meeks
*Attorney, Agent, or Firm*—Burns, Doane, Swecker & Mathis, L.L.P.

[57] ABSTRACT

A method of forming a gaseous treatment atmosphere capable of depositing a silicon on a metal substrate comprising the steps of:

converting an initial gas mixture into a primary gas mixture in an apparatus for forming excited or unstable gas species, the primary gas mixture comprising excited or unstable gaseous species substantially devoid of electrically charged species, combining the primary gas mixture with an adjacent gas mixture which comprises at least one silicon precursor gas and which has not passed through the apparatus, to form the gaseous treatment atmosphere.

17 Claims, 1 Drawing Sheet

METHOD AND DEVICE FOR FORMING AN EXCITED GASEOUS TREATMENT ATMOSPHERE LACKING ELECTRICALLY CHARGED SPECIES USED FOR TREATING METALLIC SUBSTRATES

BACKGROUND OF THE INVENTION

1. Field of the Invention

The present invention relates to deposits of films containing silicon (for example silicon oxides such as silica or else silicon oxynitrides $SiO_xN_y$) made on metal surfaces (such as sheet metal) for example with the aim of providing them with a coloration for esthetic reasons, or for providing them with corrosionresistance properties.

2. Description of Related Art

There are currently several deposition techniques making it possible to produce such thin layers of silicon oxide or silicon oxynitride on sheet metal.

Of these, the technique most commonly referred to is that of vapor phase deposition reactions, better known by the generic name of the CVD (chemical vapor deposition) method.

These methods consist in reacting one or more silicon precursor gases, for example silane $SiH_4$, and an oxidant such as oxygen, on the surface of the sheet metal which has been activated beforehand, the deposition being carried out at atmospheric pressure or at reduced pressure, and at a temperature which is chosen in accordance with the pressure conditions adopted:

when the deposition is carried out at atmospheric pressure, a strong thermal activation of the surface is necessary, and the deposition will therefore be carried out at an elevated temperature, typically of the order of 800° to 1000° C., when the deposition is carried out at low pressure, the adopted temperature will be lower, typically between 250° C. and 600° C., according to whether or not the CVD is assisted, for example by an electric discharge in the gas.

Those CVD methods which make it possible to operate at low temperature (as it is often desirable to do) are therefore associated with low pressure conditions. Such low pressure conditions undeniably constitute a constraint and explain the less extensive steel sheets, which are generally in the form of large areas produced in large quantities.

Using such low pressure methods moreover represents a significant extra cost, because of the cost of vacuum equipment and the high level of maintenance which is associated with them.

In this context, the Applicant Company recently proposed, in document FR-A-2,692,598, a method for depositing a layer containing silicon on a metal substrate. This method made it possible, successively or concomitantly, to preactivate the metal surface by dielectric discharge then to deposit a layer containing silicon by exposing the surface thus preactivated to an atmosphere containing a silicon precursor gas. This method was implemented at atmospheric pressure or close to atmospheric pressure.

Although this method undeniably constitutes an improvement over existing techniques, the Applicant Company has demonstrated the fact that it can be improved, in particular in that:

the distance between the sample to be treated and the electrode (the metal sheet may moreover constitute one of the metal electrodes) is critical for obtaining a perfectly homogeneous treatment, which constitutes a constraint when it is necessary to continuously treat sheet metal with variable thickness, in addition, implementation of the method requires the substrates to pass through the discharge, whence a source of contamination for the electrodes because of the presence of dust or greasy particles at the surface of the substrates, when the method concomitantly carries out preactivation and deposition, the silicon precursor gas, such as silane, is introduced directly into the discharge, whence the risk of depositing dust (powder) of silica or silicon oxides on the electrodes, which interferes with the operation of the apparatus in question, finally, the geometrical configuration making it possible to implement this method limited the power density which could be used, increasing the power density beyond this limit running the risk of leading to a delocalization of the ionized cloud.

In a more general context, the Applicant Company recently proposed, in document FR-A-2,692,730, the content of which is assumed to be incorporated herein by reference, a device for forming excited or unstable gas molecules, operating substantially at atmospheric pressure, and making it possible to achieve improved power densities.

SUMMARY AND OBJECTS OF THE INVENTION

In this context, the object of the present invention is to provide an improved method for forming a deposit of a film containing silicon on a metal substrate, making it possible:

to operate substantially at atmospheric pressure, to have a high degree of flexibility with regard to the distance between the object to be treated and the device used for carrying out this treatment, to offer an improved power density, making it possible to achieve a faster treatment rate, to prevent the silicon precursor gas used from being able to give rise to reactions inside the device in question (deposition of powders), to prevent the substrate onto which the deposit is to be made from having to pass through this device, if required, to operate at low temperature.

In order to do this, according to the invention, use is made for forming a deposit of a film containing silicon on a metal substrate, of an apparatus for forming excited or unstable gas species, in which an initial gas mixture is converted into a primary gas mixture, the apparatus being the site of an electric discharge created between a first electrode and a second electrode, which extend along an elongated main direction, the initial gas mixture passing through the discharge transversely to the electrodes and to this main direction, the primary gas mixture which is obtained at the gas outlet of the apparatus, which comprises excited or unstable gas species and which is substantially free of the electrically charged species, forming, with an adjacent gas mixture which comprises at least one silicon precursor gas and which has not passed through said apparatus, the gaseous treatment atmosphere which is brought into contact with the substrate in order to produce the deposit.

A layer of a dielectric material is advantageously arranged on the surface of at least one of the electrodes, facing the other electrode. The power used in the apparatus, normalized per unit surface area of dielectric will then advantageously be greater than 1 W/cm$^2$, preferably greater than 10 W/cm$^2$.

The gaseous treatment atmosphere is advantageously brought into contact with the substrate in order to carry out the deposition at a pressure close to atmospheric pressure.

According to the invention, the term "pressure close to atmospheric pressure" is intended to mean a pressure lying in the range [$0.1 \times 10^5$ Pa, $3 \times 10^5$ Pa].

According to the invention, the term metal surface is intended to mean any type of surface on which it may seem advantageous to make a deposit of a layer containing silicon, such as, for example, metal sheets, whether they are, for example, made of steel, stainless steel, copper or aluminum, or alloys of such elements, regardless of the dimension or thickness of the article (or product) which has the metal surface to be treated, whether these products are flat (such as metal sheets) or hollow, such as, for example, bottles. Their final industrial application may vary widely, whether these metal surfaces are, for example, used in the field of household electrical appliances, automobiles, industrial gases or else the building industry.

The term "silicon precursor gas" is intended to mean one of the many gases whose molecule contains silicon, such as, for example, silane, disilane, etc.

As will be clearly apparent to the person skilled in the art, the treatment atmosphere according to the invention, which is used for producing the deposit, is obtained by the combination of the primary gas mixture obtained at the outlet of such an apparatus for forming excited or unstable gas species, which therefore comprises such excited or unstable gas species, and the adjacent gas mixture, the primary gas mixture transferring all or part of its energy to the silicon precursor gas contained in the adjacent gas mixture and to the surface of the substrate to be treated, thus making the deposition possible. Since the silicon precursor gas has not passed through the apparatus, the risk of forming silica powder (or more generally powders of silicon compounds) inside the discharge is consequently eliminated. The substrate is furthermore in contact only with the gas outlet of the apparatus in question, and has not "dwelled" in the apparatus.

This configuration may be referred to as a "post-discharge" configuration since the primary component of the treatment atmosphere, which comprises excited or unstable gas species, is obtained at the outlet of the apparatus, which ensures the substantial absence of any electrically charged species in this primary component. The adjacent component of the treatment atmosphere, which has not passed through the apparatus, is a fortiori free of electrically charged species.

This configuration also permits clear separation of the site where the primary component of the atmosphere is generated from the site where it is used, which presents a considerable advantage in terms of contamination of the apparatus (preventing the various releases resulting from the deposition operation from polluting the interior of the apparatus, for example its electrodes). Finally, the article, which is not treated within the apparatus (for example within the discharge between the electrodes), benefits from much better flexibility as regards the "distance" aspect mentioned above.

As will also be clearly apparent to the person skilled in the art, the invention can be applied, according to the requirements expressed by the user, both to the treatment of just one of the faces of the article to be treated, and to the case when the article has to be treated on both of its faces. In the latter case, it will be suitable to arrange the requisite apparatuses in front of each face of the article.

The nature of the silicon compound deposited ($SiO_xN_y$, $SiO_x$ or $SiO_xN_yH_z$) will be closely linked with the experimental conditions used, in particular with the partial pressures of oxygen and nitrogen in the treatment atmosphere. It will, for example, be possible to control the nature of the film deposited by altering, in particular, the nature of the inert gas used both in the initial mixture and in the adjacent mixture, and also the level of the partial pressure of oxygen maintained within the treatment atmosphere.

As will also be clearly apparent to the person skilled in the art, the metal substrate to be treated may be brought into contact with the gas outlet of a single apparatus or a plurality of apparatuses, which are placed in parallel over the width of the substrate, or else successively with the gas outlets of a plurality of apparatuses for forming excited or unstable gas species, placed in series.

The metal substrate to be treated may optionally have been subjected beforehand to a surface preparation (or treatment) using one of the many available methods, whether in liquid phase or in gas phase.

According to one of the embodiments of the invention, the initial gas mixture comprises an inert gas and/or a reducing gas and/or an oxidizing gas. The inert gas may, for example, consist of nitrogen, argon, helium or a mixture of such inert gases. The reducing gas may, for example, consist of hydrogen, $CH_4$ or else ammonia, or a mixture of such reducing gases. For its part, the oxidizing gas may, for example, consist of oxygen or $CO_2$ or else $N_2O$, $H_2O$, or a mixture of such oxidizing gases. The list of gases given in each category is, of course, only an indication and does not imply any limitation.

Besides the silicon precursor gas or gases, the adjacent gas mixture will advantageously comprise an inert gas and/or a reducing gas and will optionally comprise an oxidizing gas.

According to another embodiment of the invention, the silicon precursor gas in the adjacent gas mixture is monosilane $SiH_4$.

According to one of the aspects of the invention, the metal substrate to be treated is heated to a temperature between ambient temperature and 400° C.

According to one of the embodiments of the invention, the metal substrate to be treated is brought in front of the gas outlet of an apparatus for forming excited or unstable gas species, optionally in front of the gas outlets of a plurality of apparatuses placed in parallel over the width of the substrate and/or successively in front of the gas outlets of a plurality of apparatuses placed in series, by a conveyor system passing through an internal space which is bounded by a covering assembly (for example a tunnel or a set of elementary covers) and is isolated from the surrounding atmosphere, said assembly being connected to said apparatus in leaktight fashion or including said apparatus.

According to one of the embodiments of the invention, the treatment atmosphere successively encountered by the article to be treated along the conveyor is zoned as follows:

a) at least one of the apparatuses for forming excited or unstable gas species converts a different initial gas mixture than that converted by the apparatus preceding it in said assembly, and/or b) the adjacent gas mixture used with at least one of the apparatuses for forming excited or unstable gas species is different than that used with the apparatus preceding it in said assembly.

Steps a) and b) above may, for example, relate to the same apparatus.

It will thus, for example, be possible to use mixtures whose reducing power increases from one apparatus to another, or else to alter this "successive composition of the treatment atmosphere" parameter in order to produce multilayer deposits, each layer being of different and controlled thickness and structure.

The invention also relates to a device suitable in particular for implementing the invention, comprising a covering assembly bounding an internal space through which means for conveying the metal substrates to be treated pass and which is isolated from the surrounding atmosphere, connected to or including one or more apparatuses for forming excited or unstable gas species, mounted in series and/or in parallel, comprising at least one tubular gas passage having an axis, formed between an outer electrode and an inner electrode, at least one of the electrodes having, facing the other, a dielectric coating, the electrodes being connected to a high-voltage and high-frequency source, the outer electrode surrounding the dielectric and having a so-called initial gas inlet and a so-called primary gas outlet which are elongated, parallel to the axis and substantially diametrically opposite, said gas outlet opening inside said assembly which is equipped with at least one means for injecting a so-called adjacent gas which has not passed through said apparatus or apparatuses.

The device optionally also includes a mean for heating the metal substrates to be treated.

Infrared lamps present in the tunnel or the set of covers, or convection heating (hot tunnel walls) or else the fact that the article is placed on a heating substrate holder may, for example, be envisaged for this heating means.

Other characteristics and advantages of the present invention will emerge from the following description of embodiments which are given by way of illustration but without implying any limitation, and are made with reference to the appended drawings, in which:

DETAILED DESCRIPTION OF PREFERRED EMBODIMENTS

Figure 1:
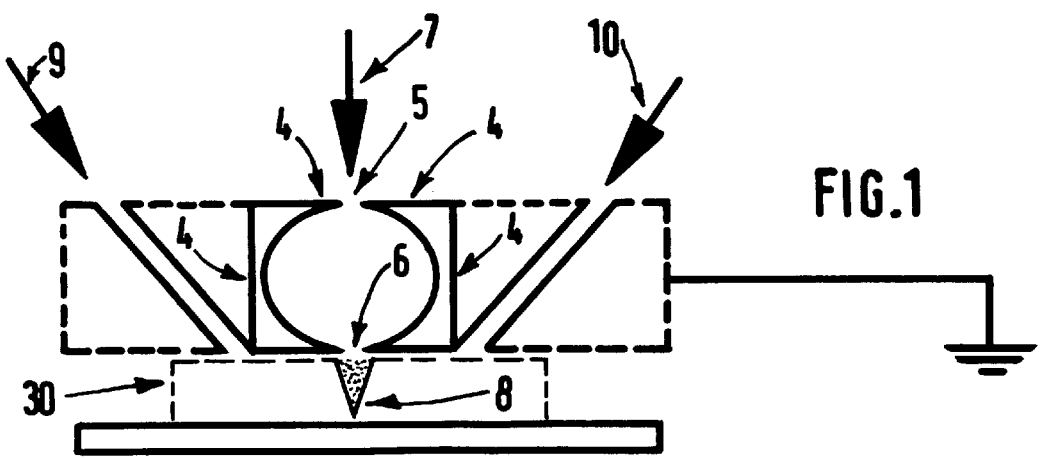
FIG. 1 is a schematic representation of a simplified device suitable for implementing the invention.

In FIG. 1, 4 schematically represents an apparatus for forming unstable or excited gas species, fed at its gas inlet 5 with an initial gas mixture 7. A primary gas mixture 8 is obtained at the gas outlet 6.

A metal substrate 1, placed in front of this gas outlet 6, is further exposed to an adjacent mixture which, in the embodiment represented, arrives through two gas inlets 9, 10, this adjacent mixture not having passed through the apparatus 4 for forming excited or unstable gas species.

In this FIG. 1, the dashed rectangle 30 symbolically represents the zone where the primary and adjacent gas mixtures interact in order to produce the deposit containing silicon on the metal substrate 1.

Figure 2:
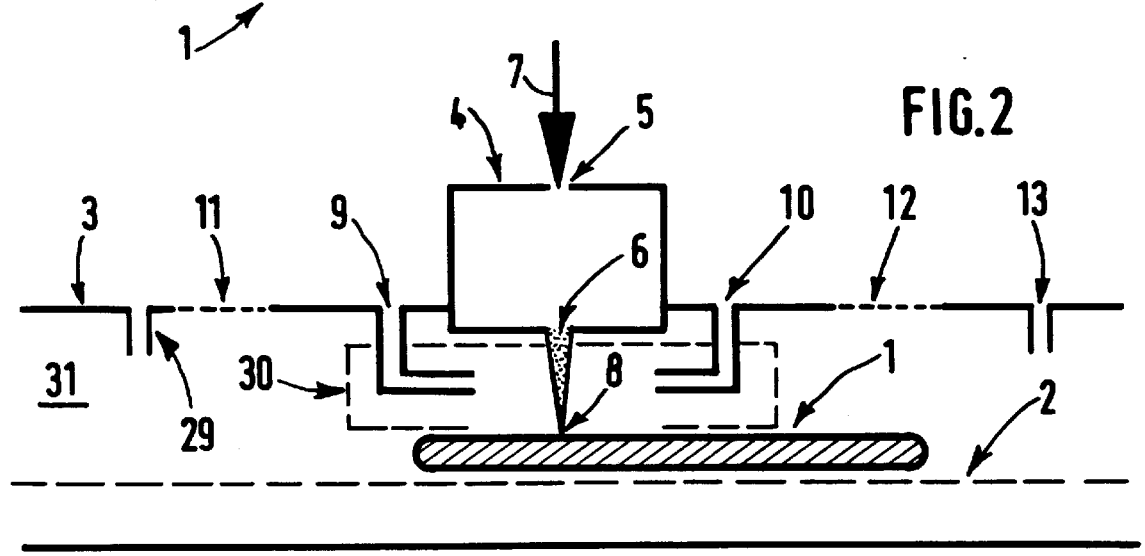
FIG. 2 is a schematic representation of one embodiment of the invention which comprises a tunnel.

FIG. 2, which is a particular embodiment of the invention, shows a tunnel 3, bounding an internal space 31, in which the metal substrate 1 is conveyed using a conveyor means 2.

The metal substrate 1 is brought in front of the gas outlet 6 of an apparatus 4 for forming excited or unstable gas species, where it comes into contact with the primary gas mixture 8 obtained from the initial mixture 7 and with the adjacent mixture which enters through the gas inlets 9 and 10, this adjacent mixture not having itself passed through the apparatus 4.

Here again, the dashed rectangle 30 schematically represents the zone of interaction between the primary gas mixture 8 and the adjacent mixture arriving through the gas inlets 9 and 10.

The embodiment represented in FIG. 2 makes it possible to treat the metal substrate 1 using a plurality of apparatuses for forming unstable or excited gas species which are placed in series, the apparatuses placed at 11 and 12 not having been represented, number 13 illustrating an example of an additional adjacent mixture inlet.

The installation is optionally also provided with a means (not represented in FIG. 2) for heating the article 1. As indicated above, infrared lamps present in the tunnel, or convection heating (hot tunnel walls) or else the fact that the article is placed on a heating substrate holder may, for example, be envisaged for this heating means.

Figure 3:
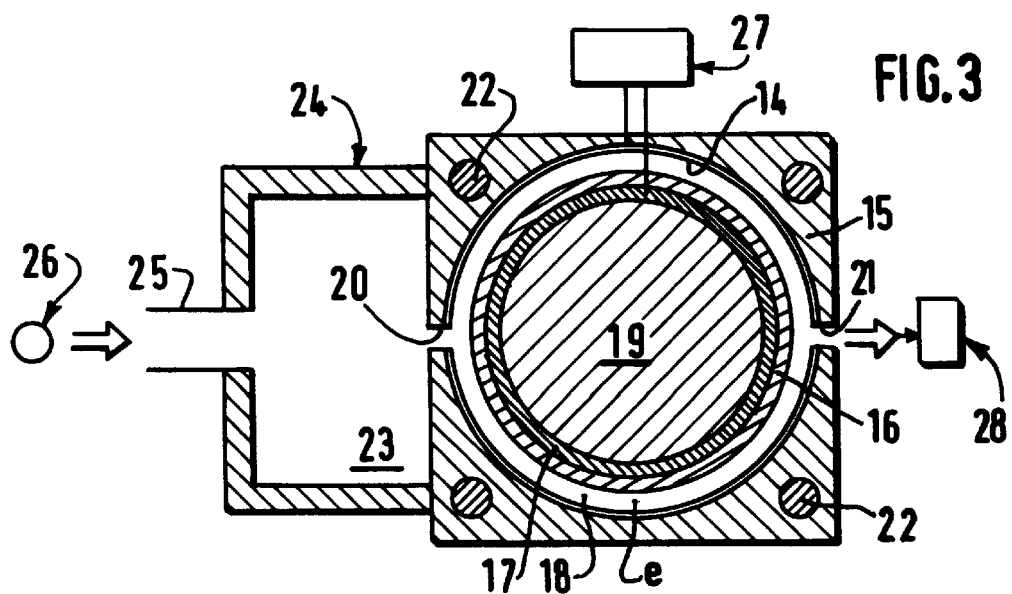
FIG. 3 is a schematic representation, in section, of an apparatus for forming unstable or excited gas species which is suitable for implementing the invention.

FIG. 3, which schematically represents a section of an apparatus for forming excited or unstable gas species which is suitable for implementing the invention (which has a cylindrical geometry in this embodiment) shows a tubular first electrode 14 which is formed, for example, by an internal face of a metal block 15 and in which an assembly consisting of a tube 16 made of dielectric material, for example ceramic, is concentrically arranged, a second electrode 17 (whose thickness has been exaggerated in FIG. 3 for better clarity) being deposited by metalization on the internal face of this tube.

The assembly consisting of the dielectric 16 and the second electrode 17 thus bounds, with the first electrode 14, a tubular gas passage 18 and, internally, an internal volume 19 in which a coolant is circulated, advantageously a freon for its electronegative nature or else deionized water.

The internal gas passage 18 has an axial extent of less than 1 m, typically less than 50 cm, and its radial thickness e does not exceed 3 mm and is typically less than 2.5 mm. The block 15 has two diametrically opposite longitudinal slots 20 and 21, respectively forming the inlet for the initial gas to be excited into the passage 18 and the outlet of the primary gas flux including excited or unstable species.

The slots 20 and 21 extend over the entire axial length of the cavity 18 and, in the embodiment represented, have a height which does not exceed the thickness e and is typically substantially identical to this thickness.

The body 15 is advantageously formed, at the periphery of the first electrode 14, with a plurality of conduits 22 for the passage of a coolant, for example water.

The gas inlet 20 communicates with a homogenization chamber or plenum 23 formed in a casing 24 which is attached to the block 15 and has a pipe 25 for supplying initial gas mixture, at a pressure lying in the range [$0.1 \times 10^5$ Pa, $3 \times 10^5$ Pa] output by an initial gas mixture source 26.

The electrodes are connected to a high-voltage and high-frequency electrical generator 27 operating at a frequency of more than 15 kHz and delivering a power of, for example, the order of 10 kW. As indicated above, this power delivered by the generator can also be advantageously expressed by normalizing it to the area of dielectric (that is to say per unit area of the dielectric electrode).

The gas flux containing the excited species which is available at the outlet 21 is sent to a user station 28, for example for depositing a layer containing silicon on a metal substrate.

An installation such as that described with reference to FIG. 2, comprising a single apparatus 4 for forming excited or unstable gas species such as that described with reference to FIG. 3, was used for implementing illustrative embodiments of the invention.

In order to do this, samples of low-carbon sheet steel with dimensions 10 cm×10 cm×0.2 mm were pretreated beforehand so as to clean them and deoxidize them before undergoing the deposition method according to the invention.

According to a first illustrative embodiment, the deposition took place under the following conditions:

the sheet metal sample was not heated, a temperature of approximately 50° C. was ensured simply by contact with the primary gas mixture, the power density used on the dielectric was of the order of 15 W/cm$^2$, the initial gas mixture was a nitrogen/hydrogen mixture with 23% of hydrogen, obtained by respective flow rates of 10 m$^3$/h nitrogen and 3 m$^3$/h hydrogen, the adjacent gas mixture, which did not pass through the apparatus for forming excited or unstable gas species, consisted of a flow rate of 0.5 l/min from an initial source with 2% of silane in argon, the pressure maintained in the tunnel was close to atmospheric pressure.

Each sample thus treated, in movement (2 mm/s) in a passage, thus received a deposit of approximately 100 Å A of an amorphous alloy of silicon (as examined by infrared spectroscopy).

Observation of the deposit thus produced using scanning electron microscopy made it possible to ensure that the deposit was perfectly continuous and dense.

In a second illustrative embodiment, adopting the same power density, the same supply conditions of the discharge in the initial gas mixture, but this time using 5 liter/minute of the silane/argon mixture with 2% of silane in order to produce the adjacent gas mixture, and this time operating at a temperature of 200° C., a 5000 Å deposit of an amorphous alloy of silicon on the low-carbon steel sample was obtained, with a speed of advance of 1 mm/s.

Here again, observation of the deposit with the aid of scanning electron microscopy made it possible to ensure that the deposit obtained was perfectly continuous and dense.

The two examples above show that, according to the invention, high-quality deposits containing silicon can be obtained on a metal substrate at low temperature (or even at ambient temperature).

Although the present invention has been described with reference to particular embodiments, it is in no way limited thereto but instead is susceptible of modifications and variants which will be apparent to the person skilled in the art, in the context of the claims which follow.

We claim:

1. A method of forming a gaseous treatment atmosphere for depositing a silicon containing film on a metal substrate comprising the steps of:

converting an initial gas mixture into a primary gas mixture in one or more apparatuses for forming excited or unstable gas species, said primary gas mixture comprising excited or unstable gaseous species substantially devoid of electrically charged species, combining said primary gas mixture with an adjacent gas mixture which comprises at least one silicon precursor gas and which has not passed through said one or more apparatuses for forming excited or unstable gas species, to form the gaseous treatment atmosphere, wherein at least one of said one or more apparatuses for forming excited or unstable gaseous species comprises a first electrode and a second electrode which create a site of an electrical discharge, wherein said first and second electrodes extend along an elongated main direction and said initial treatment gas mixture passes through the discharge created in said apparatus transversely to said electrodes and said main direction.

2. The method according to claim 1 further comprising the step of depositing the film containing silicon on a surface of said substrate by bringing said gaseous treatment atmosphere in contact with said substrate.

3. The method according to claim 2, wherein the gaseous treatment atmosphere is brought into contact with the metal substrate at a pressure close to atmospheric pressure.

4. The method according to claim 2, wherein the metal substrate is heated to a temperature between ambient temperature and 400° C.

5. The method according to claim 2, wherein each of the one or more apparatuses for forming excited or unstable gas species includes a gas outlet, the method further comprising the step of bringing the metal substrate of a given width to be treated in front of the gas outlet or outlets of said one or more apparatuses by a conveyor system passing through an internal space which is bounded by a covering assembly and is isolated from a surrounding atmosphere, said assembly being connected to said one or more apparatuses in leaktight fashion or surrounding said one or more apparatuses.

6. The method according to claim 5, wherein a plurality of apparatuses for forming excited or unstable gas species are present, and said plurality of apparatuses are arranged in series and/or in parallel in relation to said conveyor system.

7. The method according to claim 6, wherein the plurality of apparatuses for forming excited or unstable are placed in series or in series and in parallel, the method further comprising zoning the gaseous treatment atmosphere successively encountered by the metal substrate to be treated along the conveyor as follows:

a) at least one of said plurality of apparatuses for forming excited or unstable gas species converts a different initial gas mixture than that converted by the apparatus preceding it in said covering assembly, and/or b) the adjacent gas mixture used with at least one of said plurality of apparatuses for forming excited or unstable gas species is different than that used with the apparatus preceding it in said covering assembly.

8. The method according to claim 7 wherein both of steps a) and b) take place and the at least one apparatus for forming excited or unstable species described in step (a) that converts a different initial gas mixture than the apparatus preceding it in said covering assembly is the same apparatus as the at least one apparatus for forming excited or unstable species described in step (b) that has a different adjacent gas mixture used with it than the apparatus preceding it in said assembly.

9. The method according to claim 1, wherein a layer of a dielectric material is arranged on a surface of at least one of the electrodes, facing the other electrode.

10. The method according to claim 1, wherein said initial gas mixture comprises at least one of an inert gas, a reducing gas and an oxidizing gas.

11. The method according to claim 1, wherein said adjacent gas mixture comprises, in addition to the at least one silicon precursor gas, at least one of an inert gas and a reducing gas and, optionally an oxidizing gas.

12. The method according to claim 1, wherein $SiH_4$.

13. The method according to claim 1, wherein a layer of a dielectric material is arranged on a surface of at least one of the electrodes, said surface facing the other electrode and wherein the power used in said apparatus, normalized per unit surface area of dielectric, is greater than 1 $W/cm^2$.

14. The method according to claim 13, wherein the power used in said apparatus is greater than 10 $W/cm^2$.

15. A device for forming a deposit of a film containing silicon on metal substrates comprising:
- a covering assembly bounding an internal space through which means for conveying the metal substrates pass and which is isolated from a surrounding atmosphere, said covering assembly connected to or surrounding one or more apparatuses for forming excited or unstable gas species
- at least one of said one or more apparatuses comprise at least one tubular gas passage having an axis, formed between an outer electrode and an inner electrode, the electrodes being connected to a voltage means, the outer electrode having an initial gas inlet and a primary gas outlet which are elongated, parallel to the axis and substantially diametrically opposite, said gas outlet opening inside said covering assembly, said covering assembly is equipped with at least one means for injecting an adjacent gas which has not passed through said apparatus or apparatuses.

16. The device of 15, wherein a plurality of apparatuses for forming excited or unstable gas species are present, and said plurality of apparatuses for forming excited or unstable gas species are arranged in series and/or in parallel in relation to said means for conveying the metal substrates.

17. The device of claim 15 wherein at least one of the electrodes has, facing the other, a dielectric coating and the outer electrode surrounds the dielectric coating.

* * * * *